US012796104B2

(12) United States Patent
Syu et al.

(10) Patent No.: US 12,796,104 B2
(45) Date of Patent: Nov. 10, 2026

(54) SYSTEMS AND METHODS FOR SUPER POWER RAIL (SPR) ANALOG CELLS DESIGN

(71) Applicant: Taiwan Semiconductor Manufacturing Company, Ltd., Hsinchu (TW)

(72) Inventors: Ming-Cheng Syu, Hsinchu (TW); Yu-Tao Yang, Hsinchu (TW); Wen-Shen Chou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 369 days.

(21) Appl. No.: 18/405,948

(22) Filed: Jan. 5, 2024

(65) Prior Publication Data

US 2025/0228010 A1 Jul. 10, 2025

(51) Int. Cl.
*H10D 89/10* (2025.01)
*G06F 30/392* (2020.01)
*H10W 20/00* (2026.01)

(52) U.S. Cl.
CPC .......... *H10D 89/10* (2025.01); *G06F 30/392* (2020.01); *H10W 20/01* (2026.01)

(58) Field of Classification Search
None
See application file for complete search history.

(56) References Cited

U.S. PATENT DOCUMENTS 9,876,031 B1 * 1/2018 Shimizu ................ H10B 43/27
10,629,675 B1 4/2020 Nishikawa
11,322,597 B2 * 5/2022 Kodate ................ H10D 84/811
11,805,645 B2 * 10/2023 Tapias .................... H10B 43/27

OTHER PUBLICATIONS

Office Action issued in connection with Taiwan Appl. No. 11321156790 dated Nov. 15, 2024.

* cited by examiner

*Primary Examiner* — Bo B Jang
(74) *Attorney, Agent, or Firm* — Foley & Lardner LLP

(57) ABSTRACT

A method for fabricating integrated circuits comprises: forming, on a frontside of a substrate, a plurality of active components of an integrated circuit; forming, on the frontside of the substrate, a plurality of dummy components each laterally disposed next to one or more of the active components; forming a plurality of first via structures vertically extending through the substate from its backside to the frontside; forming a second via structure vertically extending through the substate from the backside to the frontside; and forming, on the backside of the substrate, a second interconnect structure.

20 Claims, 16 Drawing Sheets

SYSTEMS AND METHODS FOR SUPER POWER RAIL (SPR) ANALOG CELLS DESIGN

BACKGROUND

Semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
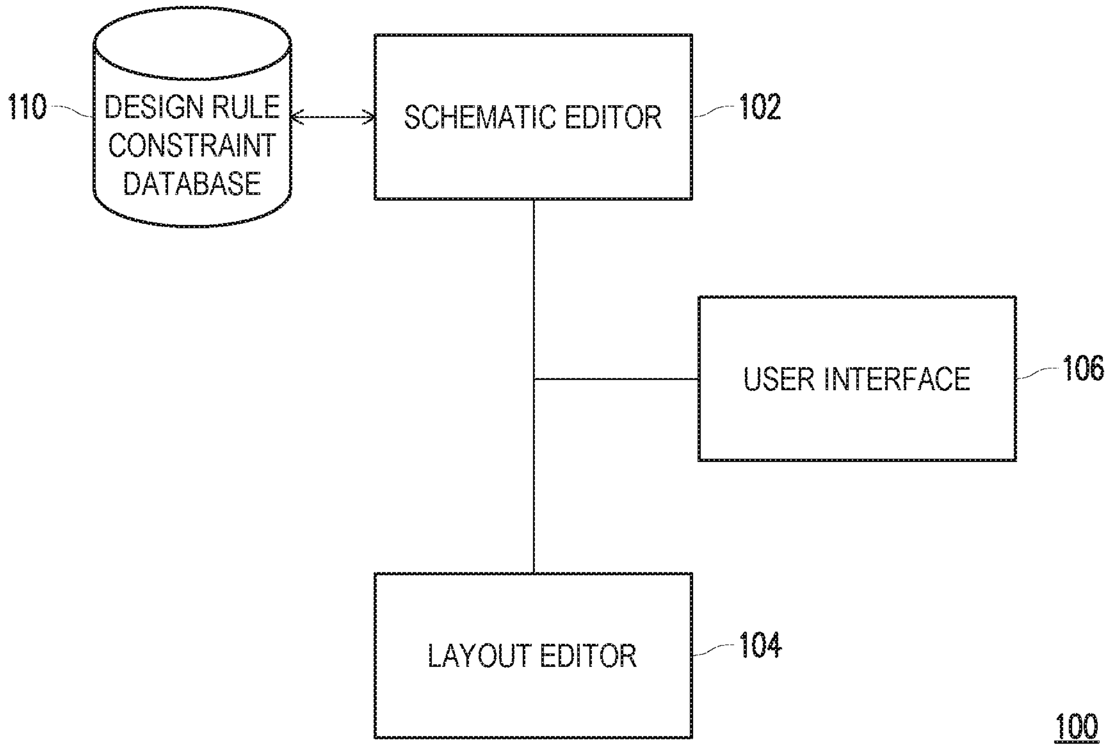
FIG. 1 illustrates a block diagram of an integrated circuit design system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

While features of integrated circuits shrink, modeling the impact of physical/layout effects up front in integrated circuit designs becomes popular. For integrated circuit designs, process design kits (PDKs) or process access kits (PAKs) have been commercially used to build up the integrated circuits. Generally, PDKs include geometric descriptions and device models of devices, such as transistors, diodes, resistors, capacitors, etc. Circuit design engineers translate PDKs to transistor netlists and/or gate-level netlists for circuit simulations, e.g., Simulation Program with Integrated Circuit Emphasis (SPICE) simulations. Based on the simulation results, circuit design engineers predict and/or modify the designs of the integrated circuits.

Embodiments disclosed herein provide techniques for automatically generating layouts for analog integrated circuits. An integrated circuit is typically constructed using cells, where a cell can contain some or all of a circuit or a component. An analog cell is a cell in which some or all of the cell includes an analog circuit or analog component. In certain embodiments, an analog cell can include one or more parameters that are definable (e.g., parameter values can vary). In some embodiments, an analog cell may have a more unified structure. In one embodiment, some or all of a non-final layout for an integrated circuit is constructed with analog cells.

In the realm of analog design, both power and ground (P/G) alongside the signal can be routing on the front-side of integrated circuits. However, this approach often encounters challenges related to the limited routing area, leading to significant voltage drop issues (IR drop) within the analog circuit. Area penalties on the front side of the integrated circuit lead to the adoption of super power rail (SPR) as a solution. However, the introduction of SPR necessitates careful consideration of how to implement the backside via (VB) and feed-through via (FTV). These components play a crucial role in efficiently connecting different layers and sides of the circuit, ensuring seamless power delivery and signal routing.

In the context of the super power rail (SPR) process, the placement of bumps formed on the back-side of the integrated circuits presents a unique set of challenges. There is a pressing need for a solution proposal to effectively route signals to the backside, ensuring the seamless operation of the analog components. Additionally, the FTV design poses another concern with a high density of cut metal gate (CMG) structures, where the ground rule is often set at about 25%, resulting in CMG densities ranging from about 71% to about 35%. This heightened CMG density introduces process risks that require careful consideration and mitigation strategies.

Furthermore, the SPR process aims to eliminate the constraints imposed by the rule, potentially impacting the overall design and performance of the analog circuits. Therefore, an in-depth impact assessment is crucial to evaluate the consequences and adapt to the evolving requirements of this process.

The present disclosure introduces a new proposal for VB+FTV signal routing to the backside, offering a unique methodology to efficiently route signals in this manner. Additionally, the present disclosure employs dual CMG structures to mitigate the challenges associated with high poly cut (CPO) density. Another innovative aspect involves the redesign of the guard ring (GR) structure, eliminating the rule constraint and resulting in significant area savings of about 3.71% within the analog block.

The advantages and benefits derived from these features are substantial. There is no extra area penalty incurred for inter-cell FTV integration, promoting efficient use of space. Ensuring consistent parasitic resistance (R) for each finger improves mismatch characteristics, enhancing overall performance. Furthermore, the implementation of back-side routing for power, ground, and/or signal connections effectively reduces IR drop concerns, contributing to the robustness and reliability of the analog circuit. This disclosure introduces a super power rail (SPR) analog cell and establishes an auto-migration flow that employs a one-to-one cell mapping approach, ensuring compliance with design rules.

FIG. 1 illustrates a block diagram of an integrated circuit design system, in accordance with some embodiments. The integrated circuit design system 100 may be a part of a PDK implemented by an EDA tool. It should be understood that the block diagram of FIG. 1 is simplified for illustrative purposes, and thus, the integrated circuit design system 100 can include any of various other components/blocks while remaining within the scope of the present disclosure.

The integrated circuit design system 100 makes it possible to reduce the number of iterations performed during the layout design process by providing a unique and complete design flow that autonomously merges a plural number of device array layouts and generates a CAD layer to enclose the merged device array layouts. The integrated circuit design system 100 also makes it possible to insert dummy patterns around the CAD layer, so as to verify the accuracy of an electrical design or performance of the layout compared to design specifications.

As shown, the integrated circuit design system 100 includes a schematic editor 102, a layout editor 104, a user interface 106, a device array editor 108, and a design rule constraint database 110 that are communicatively coupled to one another. In various embodiments of the present disclosure, the schematic editor 102, the layout editor 104, and the device array editor 108 may each include one or more sets of executable instructions for execution by at least one processor or similar device.

The schematic editor 102 can generate and edit the (e.g., circuit) schematic design of an integrated circuit that is being designed. The schematic editor 102 can perform a pre-layout simulation (e.g., a Simulation Program with Integrated Circuit Emphasis (SPICE) simulation) on the schematic design. According to various embodiments, the schematic editor 102 includes a set of executable instructions for generating or causing the pre-layout simulation of the schematic design. In other embodiments, a separate device (e.g., a simulator) in communication with the schematic editor 102 can generate the pre-layout simulation of the schematic design. The layout editor 104 can generate and edit layouts of the integrated circuits (e.g., device array layouts) in accordance with the schematic design generated by the schematic editor 102. The components of the integrated circuit design system 100 will be discussed in further detail below with respect to the method of FIG. 2.

The user interface 106 can receive and display the circuit schematic from the schematic editor 102, the layout from layout editor 104, and any calculated circuit performance parameters. The user interface 106 can receive user inputs to adjust the circuit schematics, the device array layout, and the layout of the integrated circuit, and to select specific devices in order to display circuit performance parameters of specific devices selected by a user.

Figure 2:
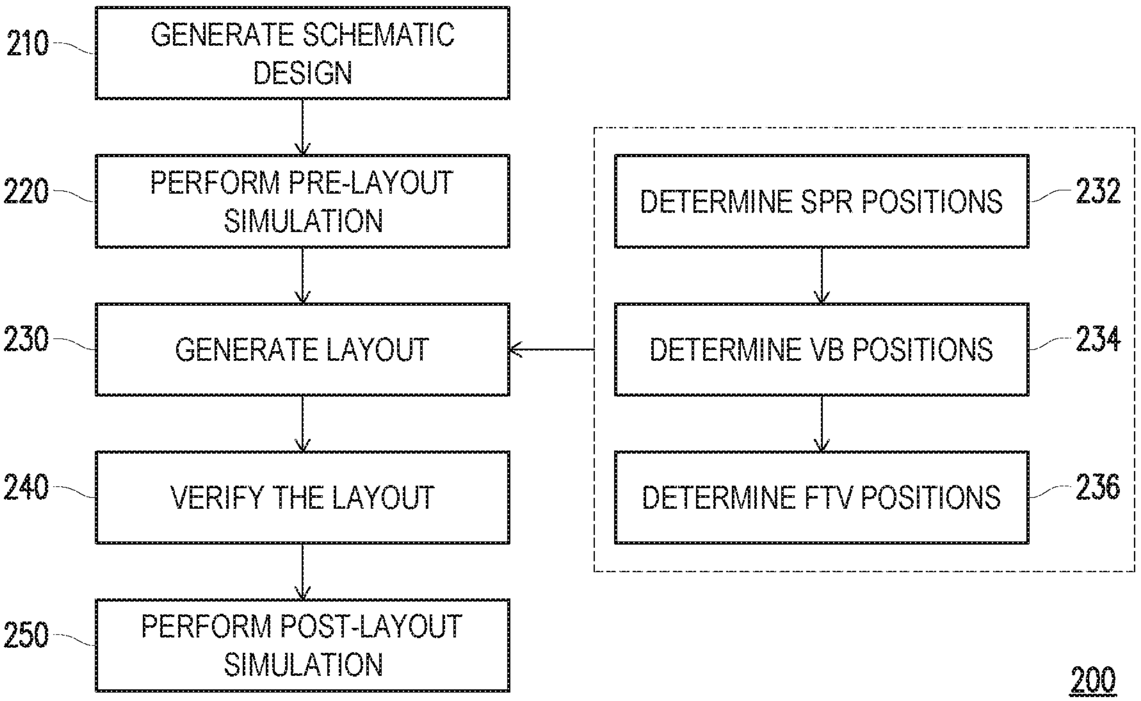
FIG. 2 illustrates an example flow chart of a method for operating the integrated circuit design system, in accordance with some embodiments.

FIG. 2 illustrates a flow chart of an example method 200 for designing an integrated circuit, in accordance with various embodiments. The method 200 can be performed by the integrated circuit design system 100 of FIG. 1, and thus, the following discussion of the method 200 will sometimes be referred to the components of FIG. 1 (e.g., the schematic editor 102, layout editor 104). It should be noted that the method 200 is merely an example and is not intended to limit the present disclosure. Accordingly, it is understood that additional operations may be provided before, during, and after the method 200 of FIG. 2, and that some other operations may only be briefly described herein.

The method 200 may start with operation 210 of generating the schematic design of an integrated circuit. In various embodiments, the schematic editor 102 can generate the schematic design based on a set of design rule constraints. The schematic editor 102 can query the design rule constraint database 110 for the set of applicable design rules and generate the schematic design of the integrated circuit. The schematic of the integrated circuit may include a plural number of circuit components. The plurality of components may be operatively coupled to one another. At least a first one of the plurality of components can be electrically coupled to a supply voltage. The circuit components may each be represented as a transistor, which can be implemented as an analog cell by the integrated circuit design system 100, for example. In some other embodiments, the circuit component may be implemented as any of various other analog cells, while remaining within the scope of the present disclosure. The schematic of the integrated circuit may also include layout-dependent effect (LDE)-related information of each of the circuit components in a component description format (CDF). The LDE-related information can include dimensions of respective features (e.g., a number of its active regions which may be implemented as fin structures, a channel width, a channel length, a number of gate structures, a gate oxide thickness, etc.) of the circuit component.

In various embodiments, the LDE-related information can include a matching group (MG) of one or more of the circuit components, which may be defined through or otherwise received by the schematic editor 102. Specifically, the matching group may be associated with a corresponding circuit functionality. Such a matching group can be defined by a user of the integrated circuit design system 100. For example, the matching group may include one of: a current mirror, a differential pair, a biasing circuit, a distributed biasing circuit, or a clock sensitive circuit. In some embodiments, the LDE-related information can optionally include the size of a device array layout corresponding to the respective circuit component.

Next, the method 200 may proceed to operation 220 of performing a pre-layout simulation on the schematic design of the integrated circuit. In various embodiments, the schematic editor 102 can simulate the schematic design of the integrated circuit. The pre-layout simulation may be performed on a simulator, such as HSPICE® commercially available from Synopsys, Inc. (San Jose, Calif.), SPECTRE® commercially available from Cadence Design Systems, Inc. (San Jose, Calif.), or any commercially available pre-layout simulator. Upon completion of the pre-layout simulation, a layout of the integrated circuit, including one or more CAD layers that each define the boundary of certain active circuit components, can be generated collectively by the layout editor 104, which will be discussed in detail below.

Further, in various embodiments, the schematic editor 102 can simulate the schematic design with respective scaling factors based on the matching groups of the schematic design. For example, the schematic editor 102 can identify whether each of the circuit components is associated with a respective matching group. If so (i.e., associated with an assigned matching factor), the schematic editor 102 can run the pre-layout simulation (including a Monte Carlo simulation) with a relatively small factor; and if not (i.e., associated with no matching factor), the schematic editor 102 can run the pre-layout simulation (including a Monte Carlo simulation) with a relatively large factor.

Next, the method 200 may proceed to operation 230 of generating and designing a layout for the integrated circuit. In various embodiments, the layout editor 104 can generate the layout based on the schematic design (generated at operation 210) and the pre-simulation result (generated at operation 220). For example, the layout editor 104 can first generate the layout based on the schematic design and the pre-simulation result using a platform, such as VIRTUOSO® commercially available from Cadence Design Systems, Inc. (San Jose, Calif.). The layout may include a plurality of cells that are abutted to one another. Each of the plurality of components may correspond to a respective one of the plurality of cells. Concurrently or subsequently, the layout editor 104 can update, adjust, or otherwise revise the layout by adding an interconnect structure (e.g., super power rails (SPRs)), one or more feed-through vias (FTVs), and/or one or more via structure (VBs), e.g., through operations 232, 234, and 236.

For example, in operation 232, the layout editor 104 may determine a first pattern. The first pattern can be one or more interconnect structure positions. The first pattern can be configured to form an interconnect structure. The interconnect structure can be disposed on a backside of a substate opposite to a frontside of the substate and can carry a supply voltage. In some embodiments, the interconnect structure can be a super power rail (SPR). The SPR may refer to a specialized power distribution network or power rail designed to efficiently deliver power to various components and sections within an integrated circuit.

In operation 234, the layout editor 104 may determine a plurality of second patterns, which will be discussed in further detail with respect to FIG. 4. The second patterns can be via VB positions. Each of the plurality of second patterns can be configured to form a first via structure. In some embodiments, the first via structure can be a via VB. The first via structure may electrically couple the supply voltage to one or more of the components (e.g., transistors). The first via structure may have a first resistance.

In operation 236, the layout editor 104 may determine a third pattern, which will be discussed in further detail with respect to FIG. 4. The third pattern can be configured to form a second via structure. The second via structure can be one or more feed-through vias (FTVs). The second via structure may electrically couple the supply voltage to the one or more of the components (e.g., transistors). The second via structure may have a second resistance substantially lower than the first resistance.

Next, the method 200 may proceed to operation 240 of verifying the layout. In various embodiments, the integrated circuit design system 100 can include a number of verification tools to verify or otherwise check the layout. Examples of such checks include Design Rule Checks (DRCs), Layout-Versus-Schematic (LVS) checks (e.g., layout versus schematic comparison), Layout Parasitic Extraction (LPE) (e.g., a layout parameter extraction for MOS, resistor, capacitors, inductors, and/or other semiconductor devices), Resistance and Capacitance Extraction (RCX) (e.g., interconnect parasitic resistance and capacitance extractions for timing simulations), and other verification steps of checks.

After the layout (or the corresponding schematic design) passes the checks, the method 200 may proceed to operation 250 of performing a post-layout simulation on the schematic design of the integrated circuit. In various embodiments, the schematic editor 102 can simulate the schematic design of the integrated circuit. The post-layout simulation may be performed on a simulator, such as HSPICE® commercially available from Synopsys, Inc. (San Jose, Calif.), SPECTRE® commercially available from Cadence Design Systems, Inc. (San Jose, Calif.), or any commercially available pre-layout simulator.

In the post-layout simulation, various layout-dependent effects are taken into account, so that generated circuit performance parameters reflect the actual circuit more accurately. The circuit performance parameters are then compared to design specification associated with the schematic design. If the circuit performance parameters meet the requirement of the design specification, the schematic design can be approved. Otherwise, the design process reverts back to the schematic generation and editing steps, which include the pre-layout simulation (operation 220), the layout creation (operation 230), the design verification (operation 240), and the post-layout simulation (operation 250) are repeated to modify the schematic design. The process is repeated until the circuit performance parameters meet the requirements of the design specification.

Figure 3:
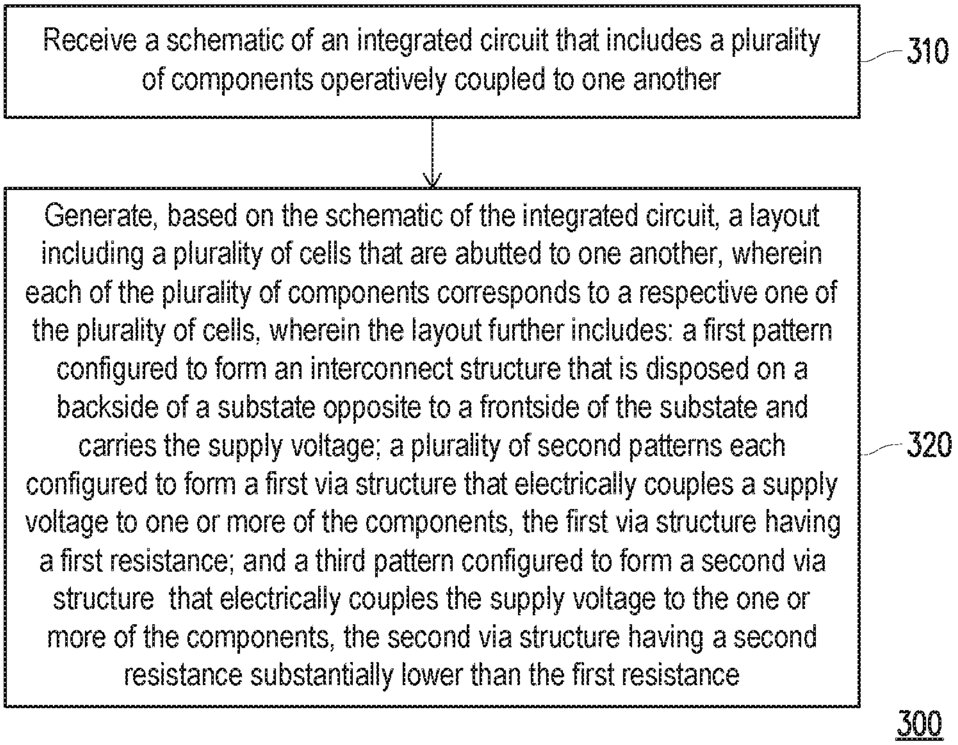
FIG. 3 illustrates an example flow chart of a method for designing an integrated circuit, in accordance with some embodiments.

FIG. 3 illustrates a flow chart of a method 300 summarizing at least some of the operations described above (FIG. 2) that are performed by one or more components of the integrated circuit design system 100 (FIG. 1), in accordance with various embodiments. Further, FIGS. 4-17 collectively provide an example integrated circuit being designed through the method 300, and thus, the following discussion of the method 300 will be provided in conjunction with FIGS. 4-17. It should be noted that the method 300 is merely an example and is not intended to limit the present disclosure. Accordingly, it is understood that additional operations may be provided before, during, and after the method 300 of FIG. 3, and that some other operations may only be briefly described herein.

In various embodiments, the method 300 may start at operation 310 in which a schematic of an integrated circuit is received by the layout editor 104. The schematic may include a plurality of components (e.g., transistors) operatively coupled to one another. At least a first one of the plurality of components can be electrically coupled to a supply voltage. The plurality of components can be formed on a frontside of a substrate.

Next, the method 300 may proceed to operation 320 in which a layout can be generated based on the schematic of the integrated circuit by the layout editor 104. The layout may include a plurality of cells that are abutted to one another. Each of the plurality of components may correspond to a respective one of the plurality of cells. In some embodiments, the operation 320 may further determine a first pattern (e.g., BM0). The first pattern can be configured to form an interconnect structure that is disposed on a backside of the substate opposite to the frontside of the substate. The interconnect structure may carry a supply voltage. The interconnect structure may extend along a first lateral direction or a second lateral direction. In some embodiments, the operation 320 may further determine a plurality of second patterns. Each of the plurality of second patterns can be configured to form a first via structure (e.g., via VBs) that electrically couples the supply voltage to one or more of the components. The first via structure may have a first resistance. In some embodiments, the operation 320 may further determine a third pattern. The third pattern can be configured to form a second via structure (e.g., FTV). The second via structure may electrically couple the supply voltage to the one or more of the components. The second via structure may have a second resistance substantially lower than the first resistance.

Figure 4:
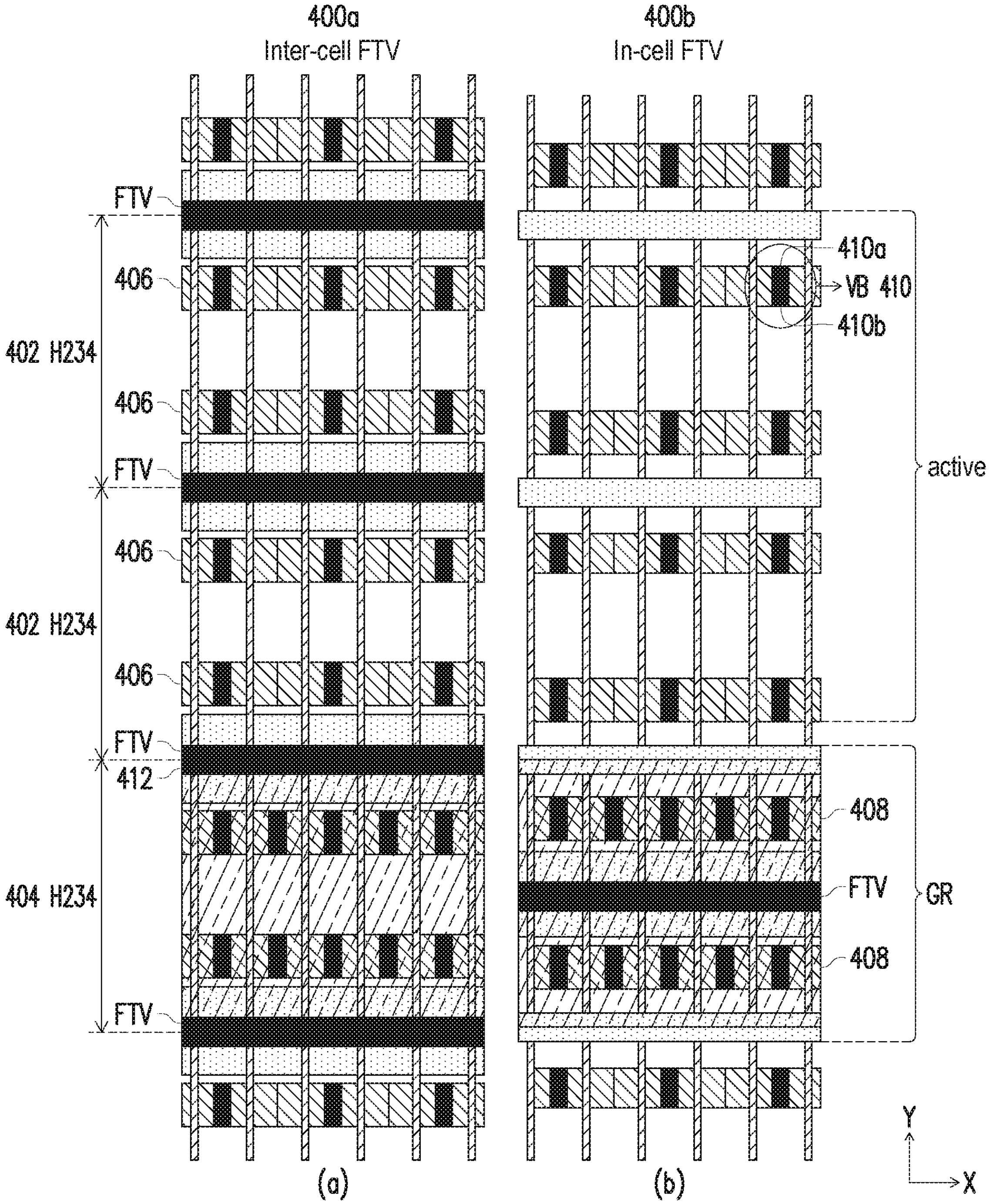
FIG. 4 illustrates layout designs of example integrated circuits, in accordance with some embodiments.

For example in FIG. 4, the layout editor 104 can generate a layout 400*a* or 400*b*. In some embodiments, the layout 400*a* or 400*b* may further include: a first one of the plurality of cells 402 corresponding to the one or more of the components; and a second one of the plurality of cells 404 that is disposed immediately next to the first cell along a first lateral direction (e.g., X direction) or a second lateral direction (e.g., Y direction). The first cell 402 may include a pair of first active regions 406 extending along the first lateral direction (e.g., X direction). The second cell 404 may include a pair of second active regions 408 extending along the first lateral direction (e.g., X direction). Each of the second patterns 410 (e.g., VBs), along the second lateral direction (e.g., Y direction), may extend from a first edge 410*a* to a second edge 410*b* of a corresponding one of the first active regions 406 and the second active regions 408.

In some embodiments, the third pattern 412 (e.g., inter-cell FTV), along the first lateral direction (e.g., X direction), may extend along an edge between the first 402 and second cells 404, as shown in FIG. 4(*a*). In certain embodiments, the third pattern 412 (e.g., inter-cell FTV), along the first lateral direction (e.g., X direction), may extend along an edge between the first cells 402. The inter-cell FTV design may involve strategic placement of FTV cells at an oxide diffusion (OD) center. The VB may connect back-side power/ground to the front-side circuit source, while VD/VDR links MD to M0. Separation between source and drain sides may prevent short circuits, and a break in MD may isolate the source and drain. Precautions prevent direct connections between PO and FTV cells, ensuring reliable integration.

In some embodiments, the third pattern 412 (e.g., in-cell FTV), along the first lateral direction (e.g., X direction), may extend between the pair of second active regions 408 of the second cell 404, as shown in FIG. 4(*b*). The guard ring (GR) (e.g., in-cell) FTV design may involve positioning FTV cells within the analog inner GR. The VD or VDR connections may overlap with MD, enabling connectivity to M0. M1 connections can be established vertically to the inner GR and may provide links to the plurality of components (e.g., transistors).

Figure 5:
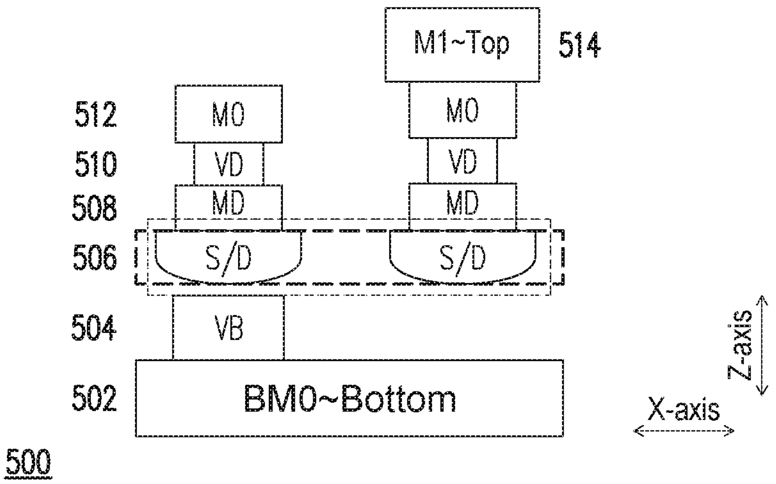
FIG. 5 illustrates a cross-sectional view of an example integrated circuit, in accordance with some embodiments.

FIG. 5 illustrates a cross-sectional view of an example integrated circuit (with a via VB) 500, in accordance with some embodiments. The integrated circuit 500 may include a bottom metal layer 0 (BM0) 502, a via VB (VB) 504, a source and drain (S/D) 506, a metal layer (MD) 508, a VD 510, a metal layer 0 (M0) 512, and a metal layer 1 (M1) 514. The BM0 502 may serve as a fundamental layer for routing signals and power throughout the circuit. The via VB 504 may provide a bridge between elements on the back and front sides of the circuit, facilitating communication and power distribution. The S/D 506 may play a pivotal role in controlling electrical current flow within these devices. The MD 508 may contribute to interconnecting components and signal routing. The 510 VD may enable the vertical transmission of data between different circuit layers, such as from MD 508 to M0 512. The M0 512 and the M1 514 may provide connecting and routing components. In some embodiments, the via VB 504 may connect back-side power/ground to the front-side circuit source, while VD/VDR 510 links MD 508 to M0 512. Separation between source and drain sides 506 may prevent short circuits, and a break in MD 508 may isolate the source and drain.

Figure 6:
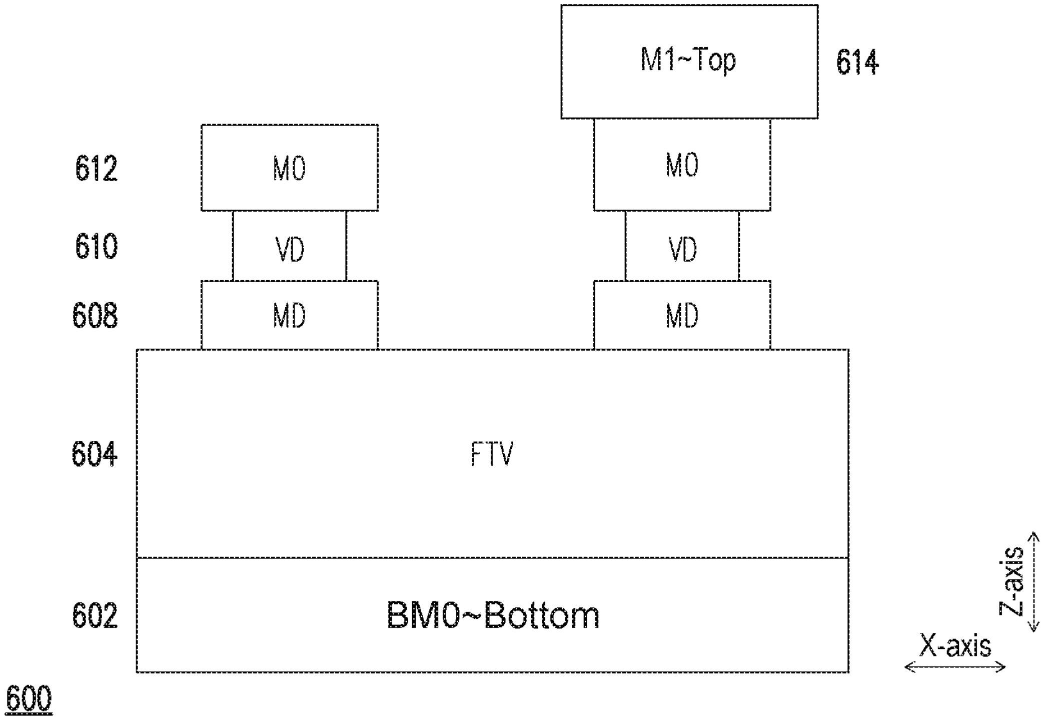
FIG. 6 illustrates a cross-sectional view of an example integrated circuit, in accordance with some embodiments.

FIG. 6 illustrates a cross-sectional view of an example integrated circuit (with an FTV) 600, in accordance with some embodiments. The integrated circuit 600 may include a bottom metal layer 0 (BM0) 602, a feed-through via (FTV) 604, a metal layer (MD) 608, a VD 610, a metal layer 0 (M0) 612, and a metal layer 1 (M1) 614. The BM0 602 may serve as a fundamental layer for routing signals and power throughout the circuit. The FTV 604 may enable connections between different layers or sides of the integrated circuit. The MD 608 may contribute to interconnecting components and signal routing. The 610 VD may enable the vertical transmission of data between different circuit layers, such as from MD 608 to M0 612. The M0 612 and the M1 614 may provide connecting and routing components. The FTV 604 may have a lower via resistance, as compared with the via VB 504.

Figure 7:
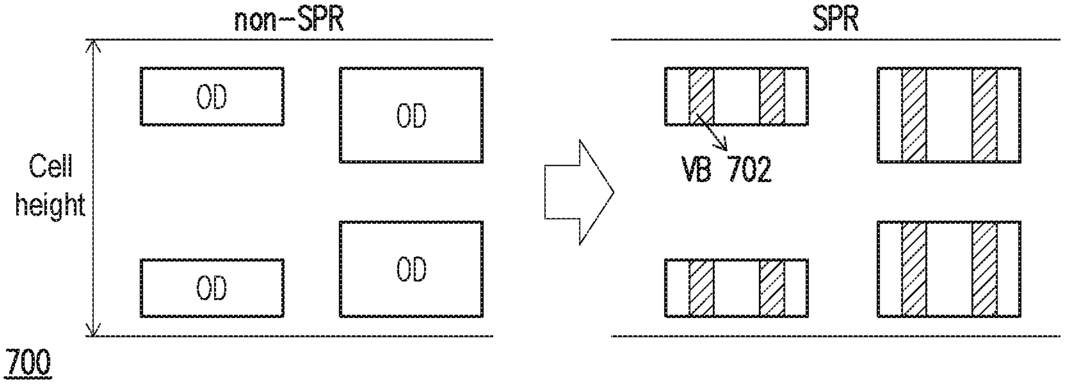
FIG. 7 illustrates a layout design of an example integrated circuit, in accordance with some embodiments.

FIG. 7 illustrates a transition from non-super power rail (SPR) to SPR in N2 analog cell. The transition may involve specific methodologies for backside via (VB) and feed-through via (FTV) implementation.

VB methodology: In this process, a backside via 702 can be used to establish a direct connection with a source, ensuring that a front-end of line (FEOL) of a non-SPR cell remains unchanged. The key focus here is to re-route power and ground from the backside while keeping the primary functionality intact, as shown in FIG. 7.

FTV Methodology: When dealing with a small oxide diffusion (OD) width, FTVs can be seamlessly incorporated through cell-cell mapping, efficiently filling in the available space. For large OD width scenarios, connectivity can be achieved by connecting FTVs through nearby inner guard rings (GR). This approach optimizes FTV placement and routing based on the width of the OD, ensuring efficient signal transmission and power distribution within the SPR analog cells.

Figure 8:
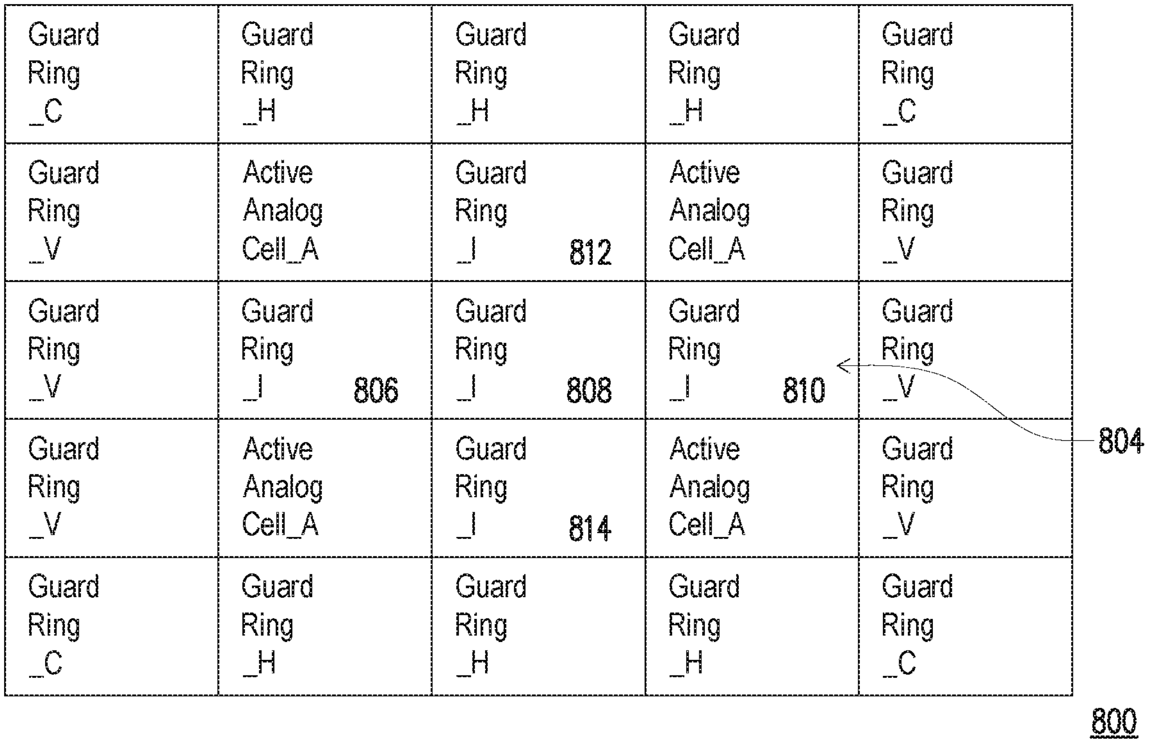
FIG. 8 depicts an example block diagram of a layout of an analog integrated circuit in accordance with some embodiments.

FIG. 8 illustrates an example block diagram of an analog cell layout/structure in accordance with some embodiments. In some embodiments, the analog cell layout 800 includes a plurality of cells. The cells can be of different cell types. The cell types may include Guard Ring_C (corner analog guard ring), Guard Ring_V (vertical analog guard ring), Guard Ring_H (horizontal analog ring), Guard Ring_I (inner analog guard ring), and Active Analog Cell_A (analog cell). The corner/horizontal/vertical/inner guard rings can be abuttable exterior guard ring blocks. These cells can employ a guard ring structure to envelop analog circuits, providing protection against noise interference while simultaneously meeting latch-up protection (LUP) requirements.

In the illustrated embodiment, the analog cell layout 800 may include a filler zone 804. Filler cells (Guard Ring_I) 806, 808, 810, 812, 814 can be inserted into the filler zone 804. Although certain numbers of Guard Ring_C, Guard Ring_V, Guard Ring_H, Active Analog Cell_A, and filler cells (Guard Ring_I) are shown in FIG. 8, other embodiments are not limited to this implementation. Additionally, the shape of the filler zone 804 can be shown as a cross or plus shape. The shape of the filler zone can have any suitable shape in other embodiments. For example, the shape of a filler zone 804 may be a square, a rectangle, a rectangle elongated along the horizontal or vertical direction (e.g., along a row or a column), an "L" shape, or a "T" shape.

In one embodiment, the filler cells 806, 808, 810, 812, 814 can be inserted as a result of a change to the non-final layout. The change can be described in an engineering change order or other document that requests and/or records design changes. Thus, the number and/or placement of the filler cells can change over time (e.g., for each change or for select changes). A filler cell can include one or more components that are included in an active cell, but the component(s) are not used or operating in the filler cell. Alternatively, a filler cell can be an empty area that is devoid of any components.

Figure 9:
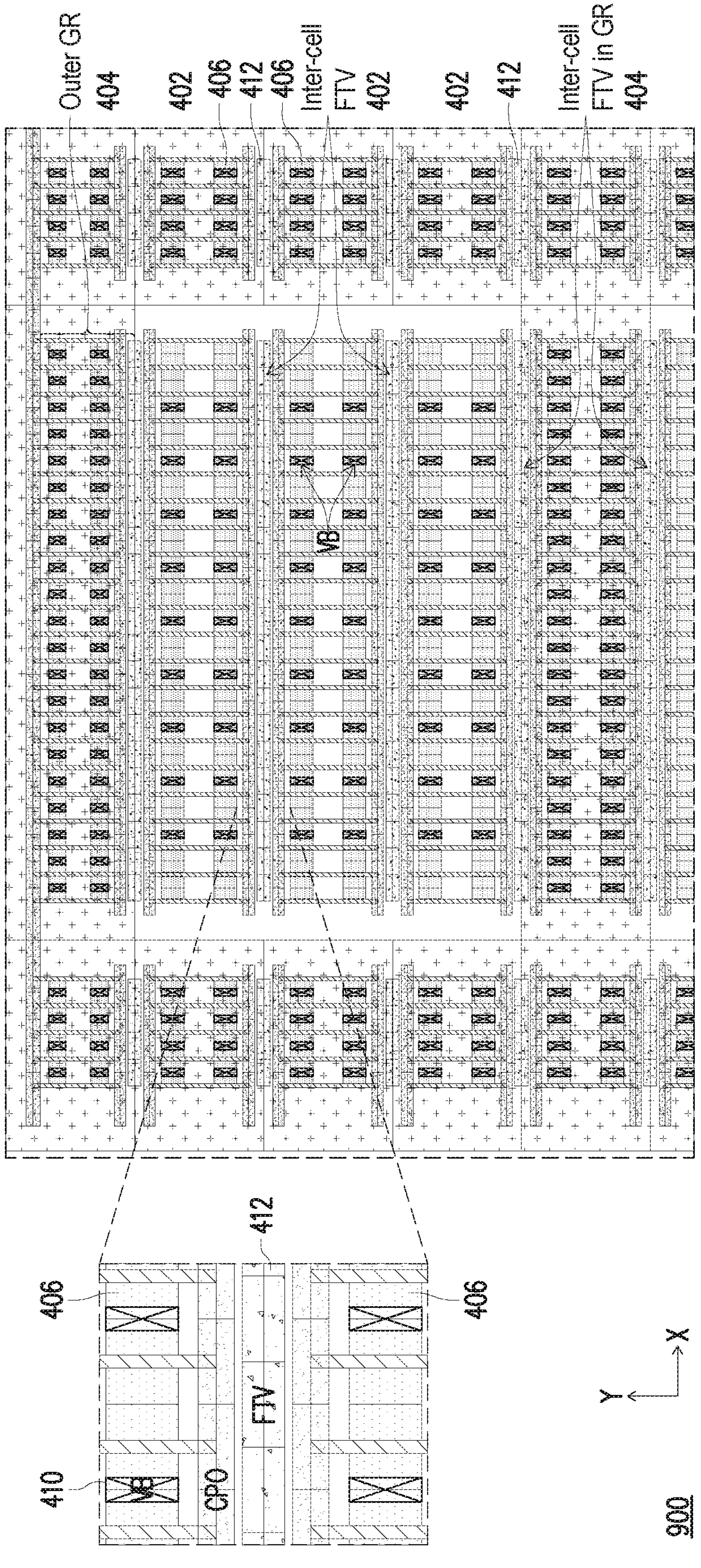
FIG. 9 illustrates an example super power rail (SPR) analog cell layout, in accordance with some embodiments.

FIG. 9 illustrates an example super power rail (SPR) analog cell layout 900, in accordance with some embodiments. The layout 900 corresponds to the inter-cell feed-through via (FTV) layout 400*a* shown in FIG. 4(*a*). The layout 900 may include a plurality of active components 402, a plurality of dummy components 404, an interconnect structure (not shown in FIG. 9), a plurality of first via structures 410, and a second via structure 412. The plurality of active components 402 may be operatively coupled to one another to form an integrated circuit 900. The plurality of active components can be arranged over a frontside of a substrate. The plurality of dummy components 404 may each laterally disposed next to one or more of the active components 402. The plurality of dummy components can be formed over the frontside. The interconnect structure 502, 602 can be disposed on a backside of the substate opposite to the frontside of the substate, as shown in FIGS. 5 and 6. The plurality of first via structures 410 may each vertically extend through the substate, as shown in FIG. 5. The plurality of first via structures 410 can be laterally disposed within a corresponding one of the active or dummy components, as shown in FIG. 9. The second via structure 412 may vertically extend through the substate, as shown in FIG. 6. The second via structure 412 may laterally extending within a corresponding one of the dummy components 412 and laterally extend along an edge between one of the active components 402 and one of the dummy components 404, or laterally extending along an edge between adjacent ones of the active components 402, as shown in FIG. 9.

In some embodiments, the second via structure 412 (e.g., inter-cell FTV), along the first lateral direction (e.g., X direction), may extend along an edge between the first cells 402. In some embodiments, the second via structure 412 (e.g., inter-cell FTV), along the first lateral direction (e.g., X direction), may extend along an edge between the first 402 and second cells 404. In some embodiments, the second cell 404 may form a part of a guard ring for the plurality of components (e.g., transistors).

Figure 10:
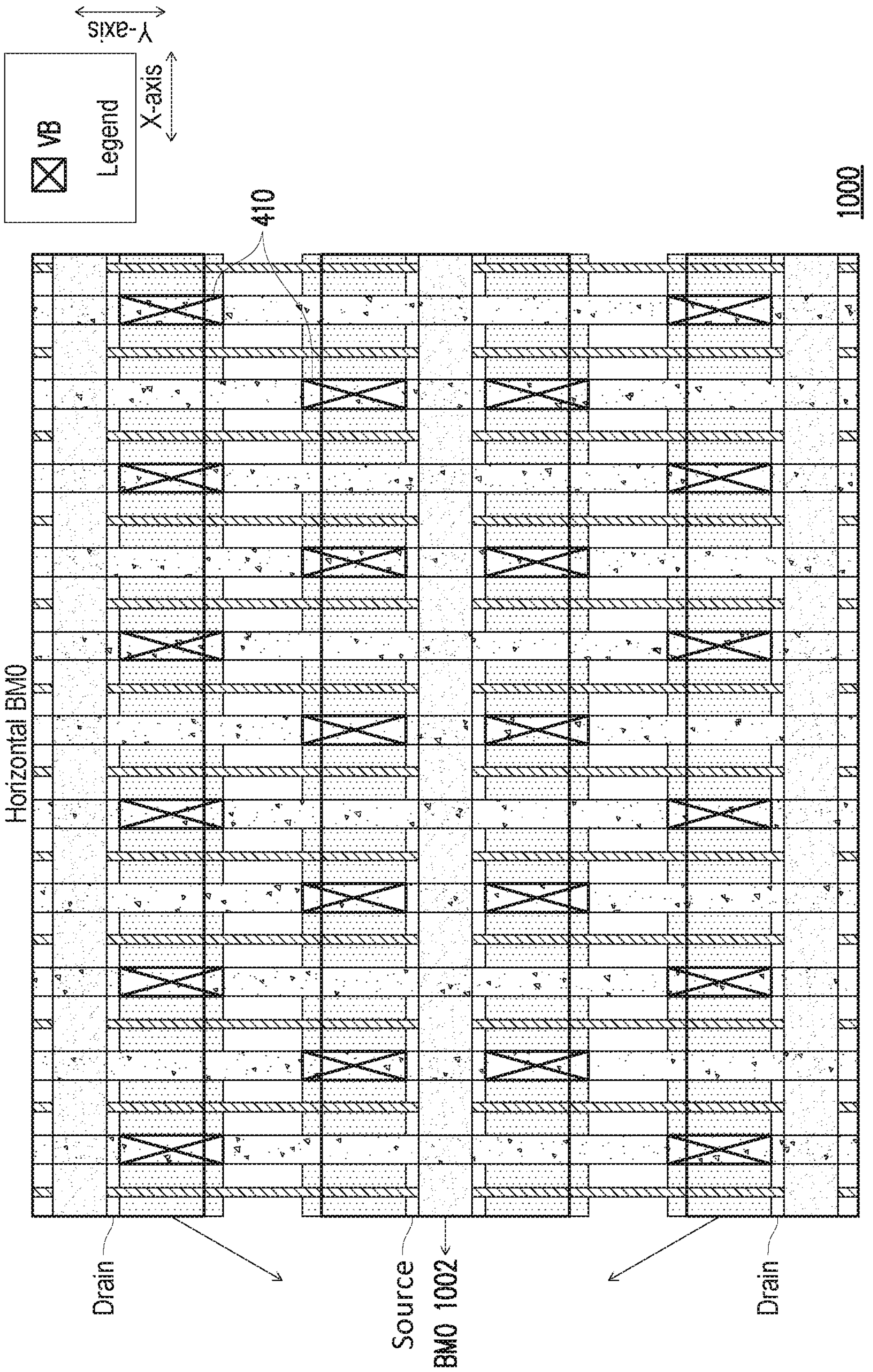
FIG. 10 illustrates an example super power rail (SPR) analog cell layout, in accordance with some embodiments.

FIG. 10 illustrates an example super power rail (SPR) analog cell layout 1000, in accordance with some embodiments. The layout 1000 of FIG. 10 is substantially similar to the layout 400 of FIG. 4, except that the arrangements of the interconnect structure (e.g., horizontal BM0) and the second patterns (e.g., via VBs) 410. The specific operations of similar elements, which are already discussed in detail in above paragraphs, are omitted herein for the sake of brevity, unless there is a need to introduce the co-operation relationship with the elements shown in FIG. 10. The interconnect structure (e.g., BM0) 1002 may extend along the first lateral direction (e.g., X-axis). The plurality of second patterns (e.g., via VBs) 410 can be arranged with respect to one another along a tilted direction between the first (e.g., X-axis) and second (e.g., Y-axis) lateral directions.

Figure 11:
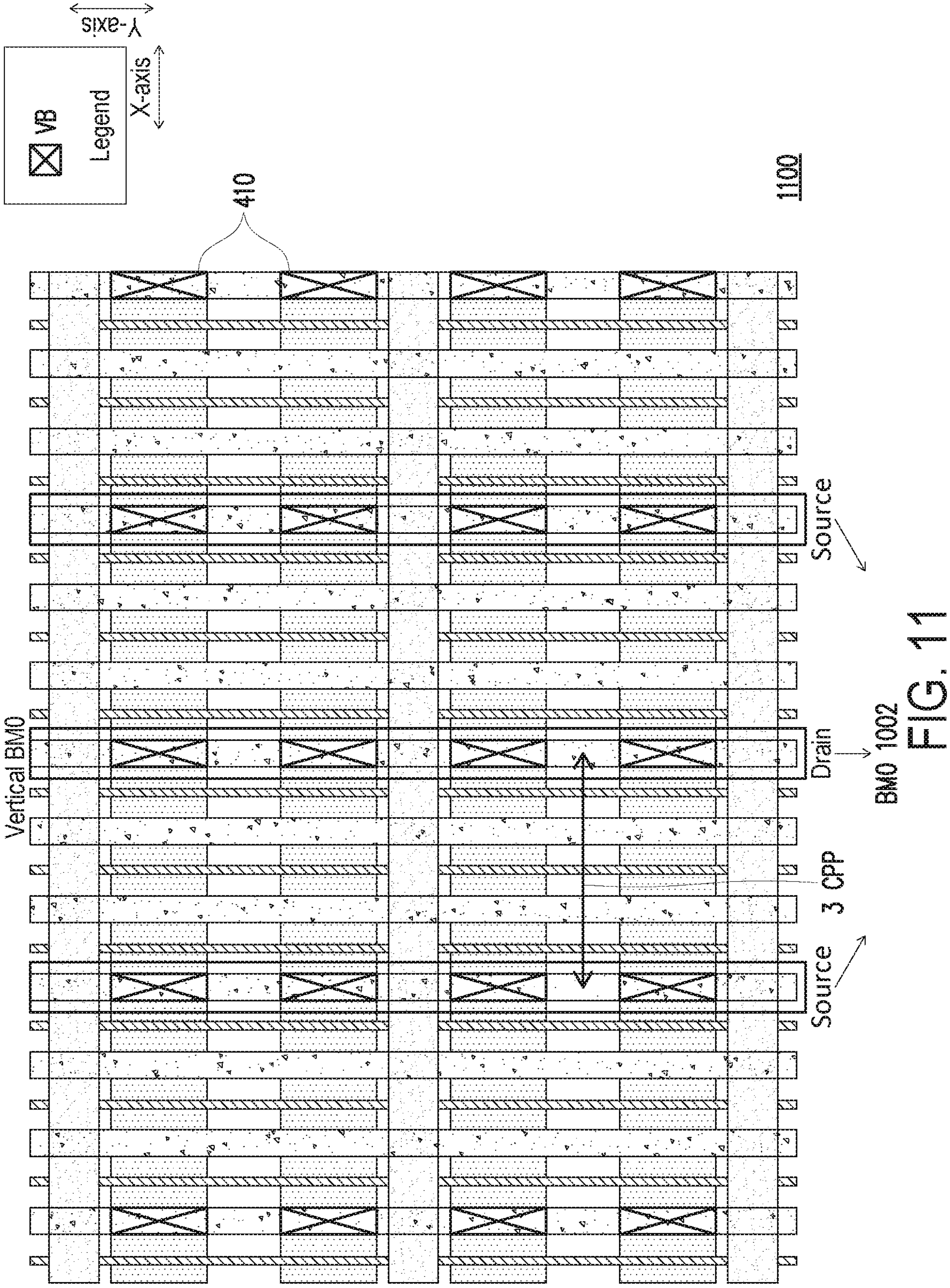
FIG. 11 illustrates an example super power rail (SPR) analog cell layout, in accordance with some embodiments.

FIG. 11 illustrates an example super power rail (SPR) analog cell layout 1100, in accordance with some embodiments. The layout 1100 of FIG. 11 is substantially similar to the layout 400 of FIG. 4, except that the arrangements of the interconnect structure (e.g., vertical BM0) and the second patterns (e.g., via VBs) 410. The specific operations of similar elements, which are already discussed in detail in above paragraphs, are omitted herein for the sake of brevity, unless there is a need to introduce the co-operation relationship with the elements shown in FIG. 11. The interconnect structure (e.g., BM0) 1002 may extend along the second lateral direction (e.g., Y-axis). Some of the plurality of second patterns (e.g., via VBs) 410 can be aligned with one another along the second lateral direction (e.g., Y-axis).

Figure 12:
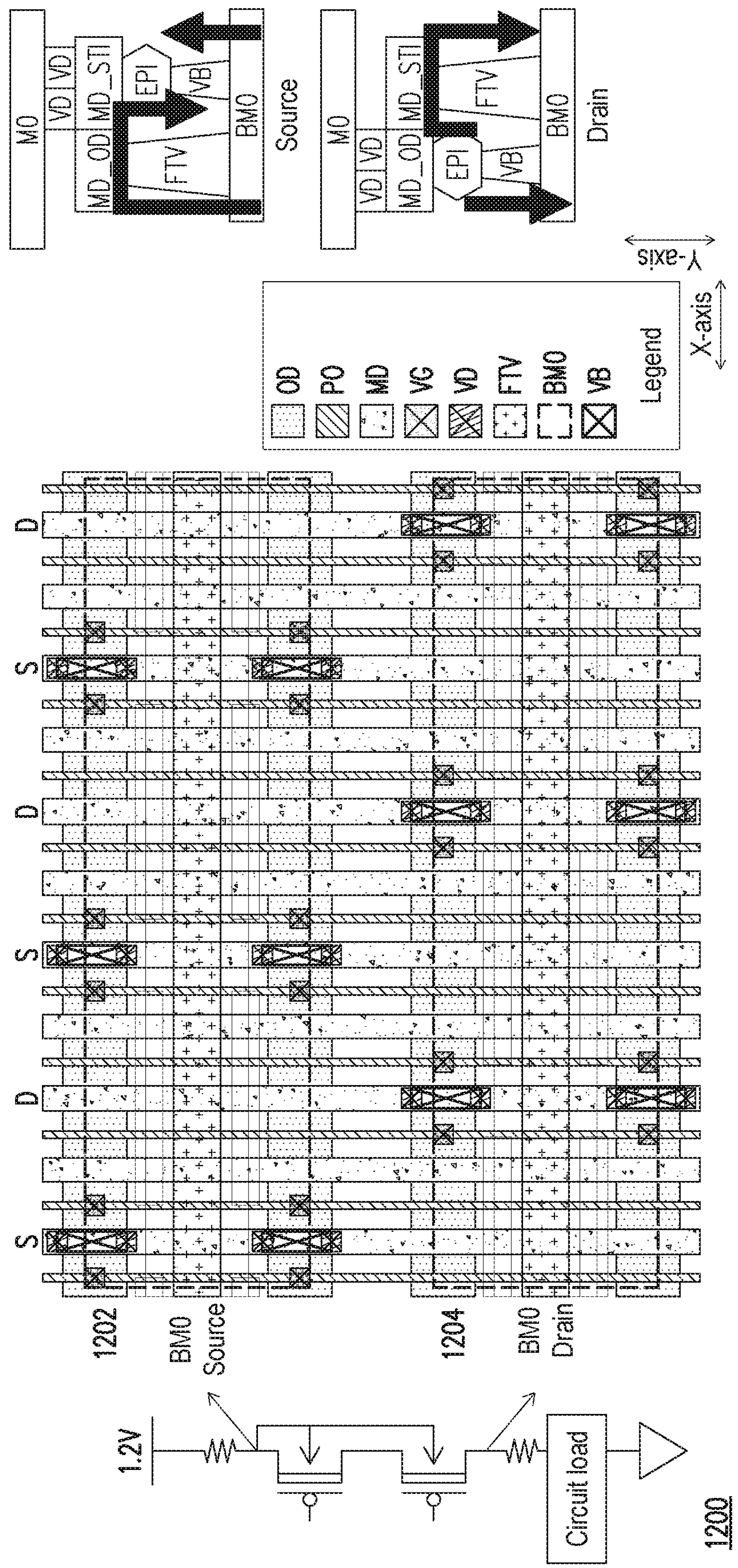
FIG. 12 illustrates an example super power rail (SPR) analog cell layout, in accordance with some embodiments.

FIG. 12 illustrates an example super power rail (SPR) analog cell layout 1200, in accordance with some embodiments. FIG. 12 demonstrates the routing of power switch signals to and from the backside of BM0. For a source signal, two pathways can be available: one traverses through the BM0, the FTV, the MD, and the EPI, while the other route involves the BM0 and the VB, ultimately connecting to the EPI. In the case of a drain signal, the drain signal can follow either of two routes: one through the EPI, the MD, the FTV, leading back to the BM0, and the other through the EPI and the VB, also connecting to the BM0.

Figure 13:
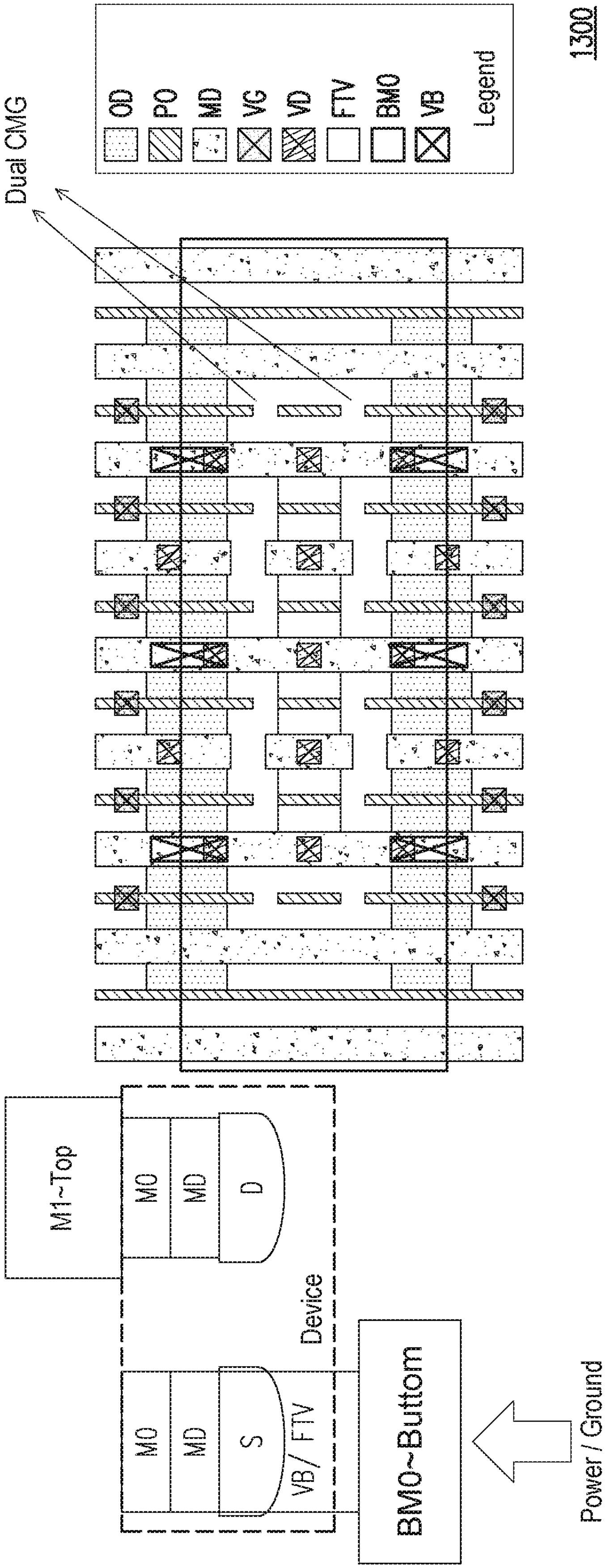
FIG. 13 illustrates an example super power rail (SPR) analog cell layout, in accordance with some embodiments.

FIG. 13 illustrates an example super power rail (SPR) analog cell layout 1300, in accordance with some embodiments. FIG. 13 presents a SPR analog cell layout 1300 for implementing dual cut metal gate (CMG) in analog SPR designs. The dual CMG may serve to prevent unintended connections between the gate net and the feed-through via (FTV) (e.g., a source or drain connection). A large CMG structures can introduce challenges related to high CMG density, which can pose process risks. However, by adopting a dual CMG strategy, the design becomes more process-friendly, effectively mitigating the issues associated with excessive CMG density. The SPR analog cell layout 1300 ensures reliable and efficient operation in analog SPR configurations while maintaining design integrity.

Figure 14:
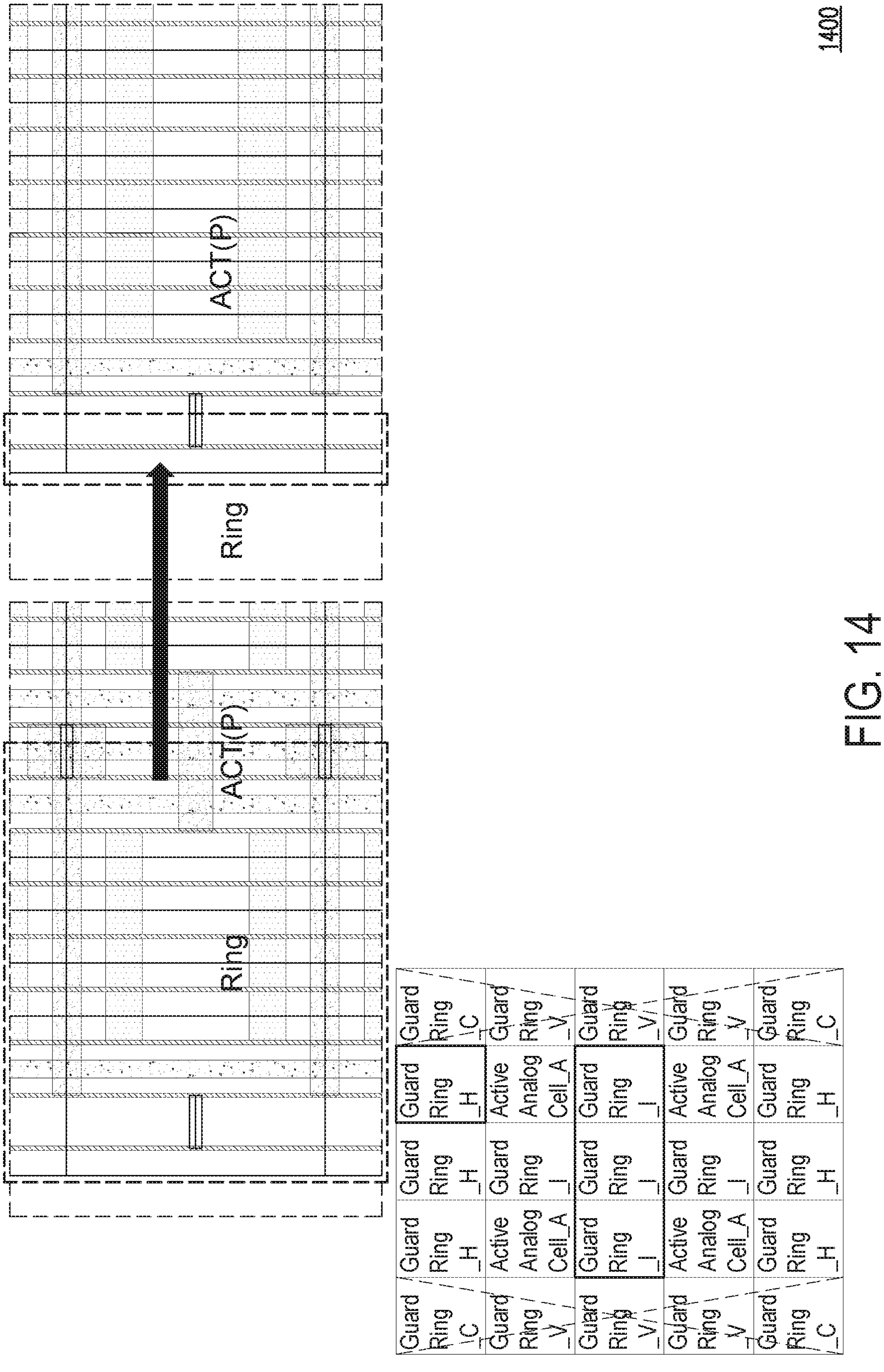
FIG. 14 illustrates an example super power rail (SPR) analog cell layout, in accordance with some embodiments.

FIG. 14 illustrates an example super power rail (SPR) analog cell layout 1400, in accordance with some embodiments. FIG. 14 demonstrates a visual representation of various strategies aimed at optimizing a utilization of area within the design. A relaxation of tap-rule standards for SPR designs is demonstrated, allowing for a more compact layout. Additionally, FIG. 14 showcases a reduction in analog guard-rings, essential for circuit protection, which contributes to efficient space utilization. Another optimization involves the removal of the vertical guard ring within the OD structure, retaining only the boundary enclosure, simplifying the design while conserving space. The SPR analog cell layout 1400 indicates an area saving of near-pad guard rings (Pad-GR) at about 33.25% and OD-Injector at about 3.87% within the overall design, underscoring the significance of these area-saving strategies in achieving an efficient SPR configuration.

Figure 15:
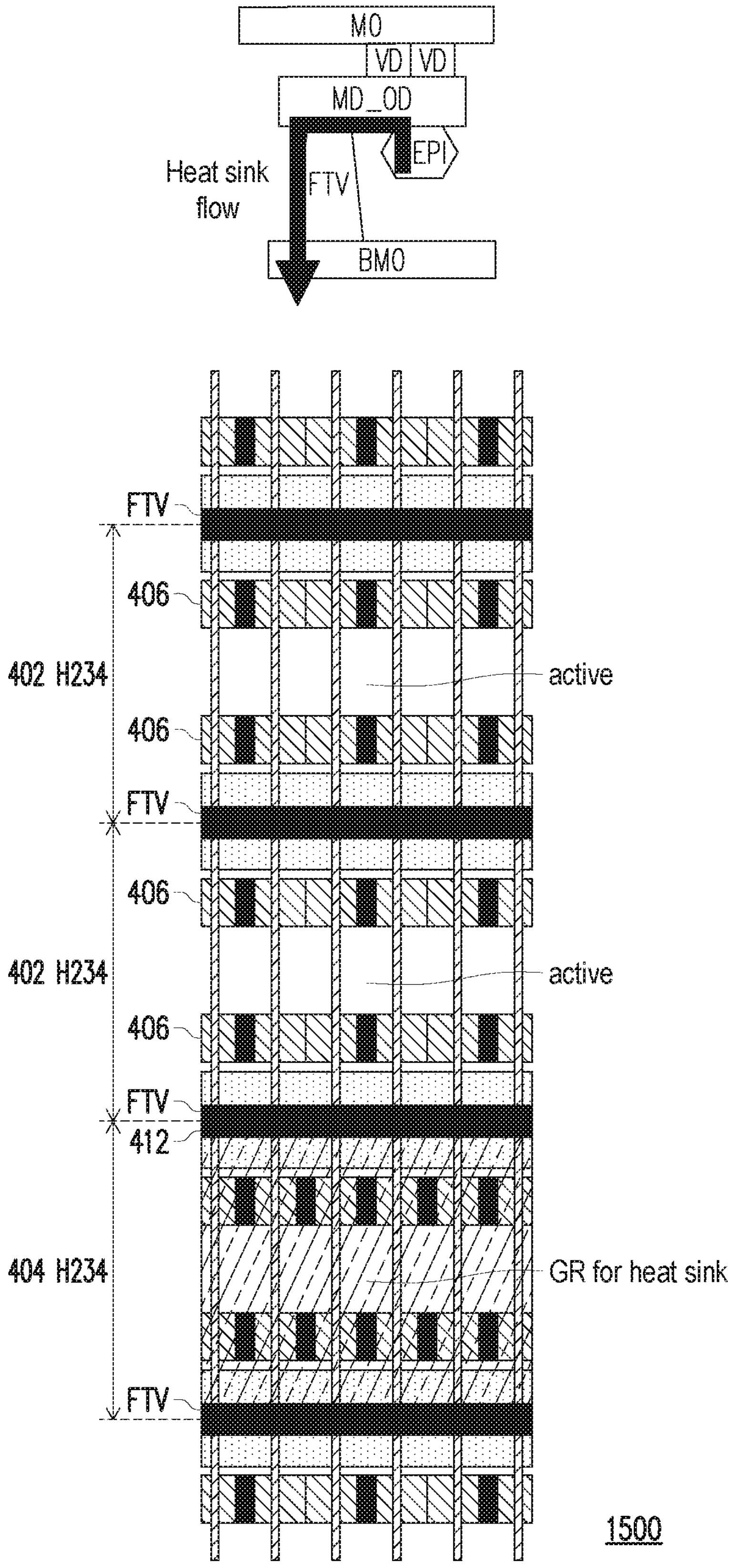
FIG. 15 illustrates a layout design of an example integrated circuit, in accordance with some embodiments.
Figure 16:
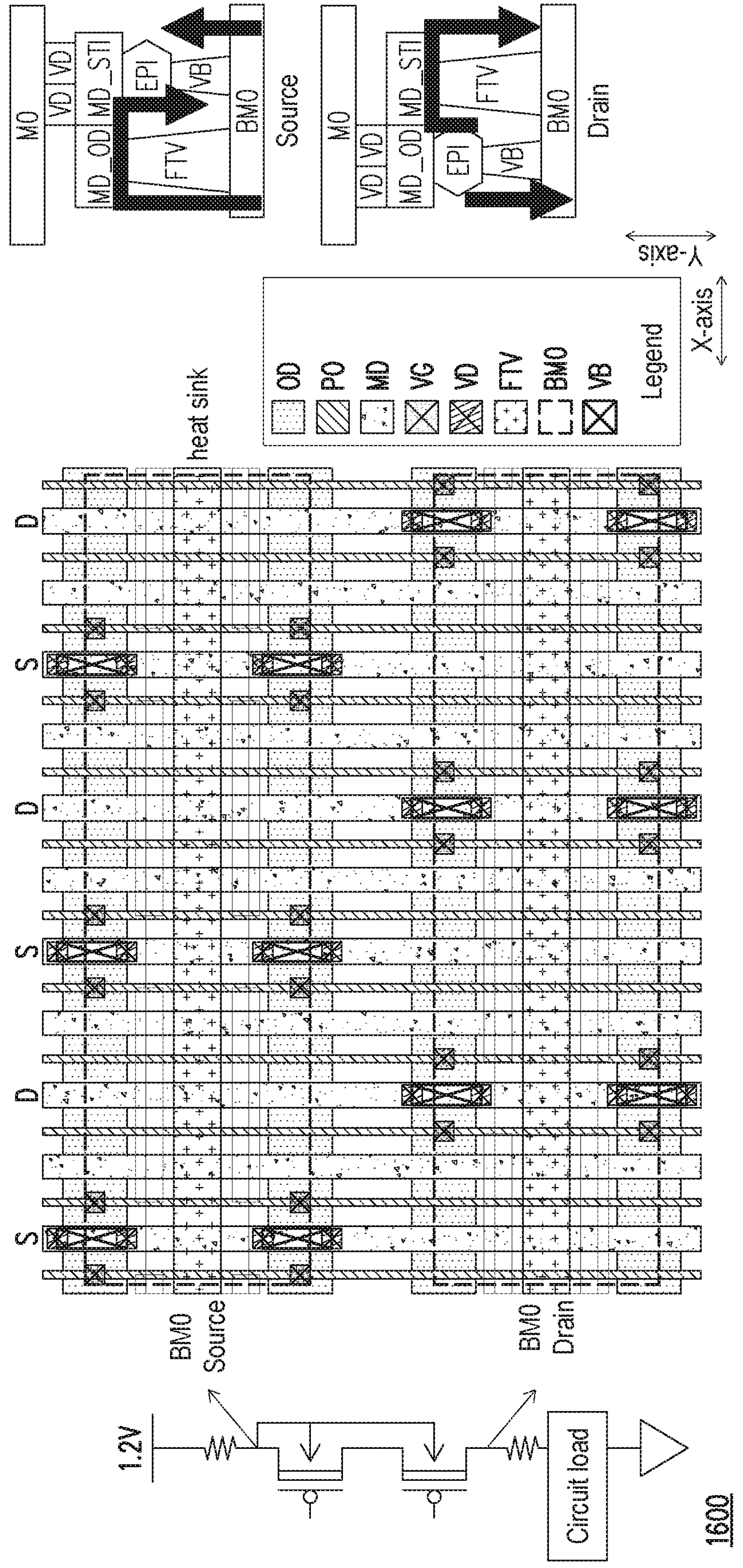
FIG. 16 illustrates an example super power rail (SPR) analog cell layout, in accordance with some embodiments.

FIGS. 15 and 16 illustrate layout designs of example integrated circuits 1500, 1600 by utilizing analog cell SPR FTV as a heat sink, in accordance with some embodiments. This design is driven by specific background considerations, including concerns related to electromigration (EM) that necessitate adjustments in cell height or M0 track width. Additionally, there is a request for accommodating various threshold voltage (VT) abutment needs. Furthermore, the absence of well pick-up mechanisms in SPR configurations raises concerns about self-heating delta-T. To address these challenges, the present disclosure repurposes inter-cell FTVs as effective heat sinks. Guidelines are proposed to facilitate the proper arrangement of GR-FTV structures, especially in high current and EM-intensive scenarios. Additionally, dual-side signal routing can provide both source/drain (S/D) and epitaxial (EPI) layers as heat sinks, enhancing thermal management within the analog cell SPR configuration.

Figure 17:
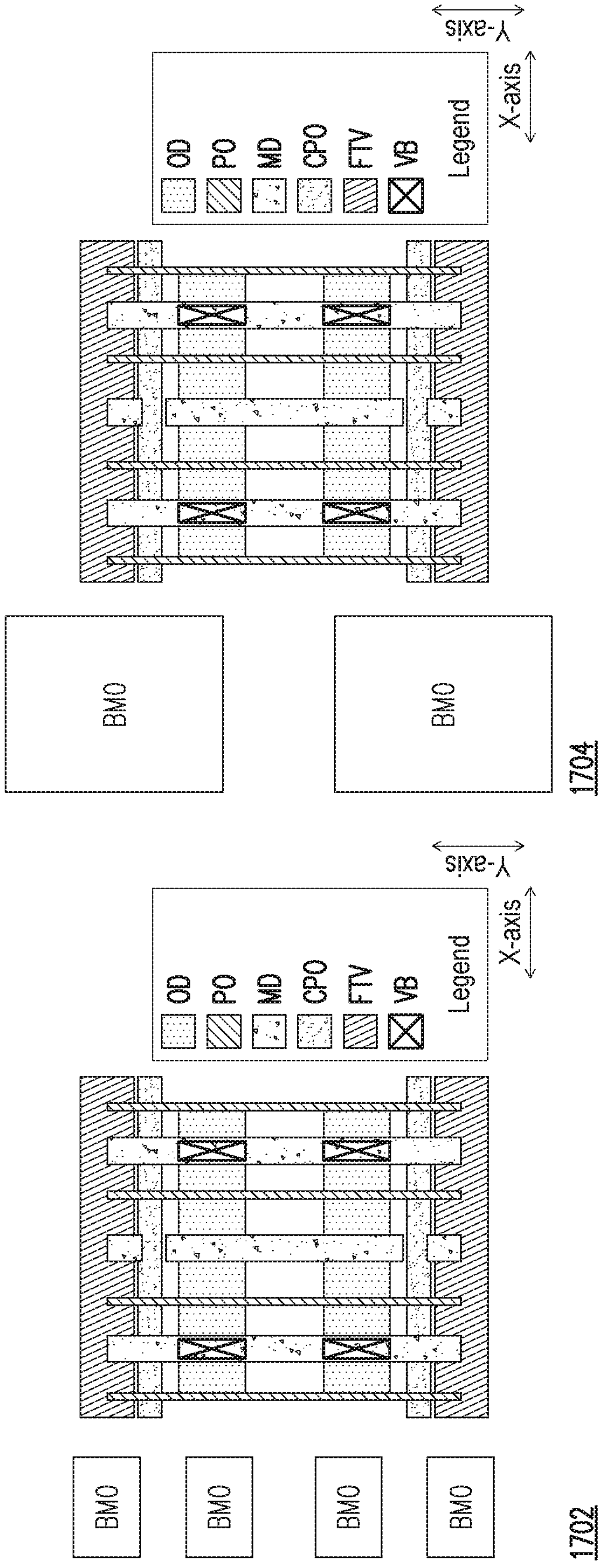
FIG. 17 illustrates an example super power rail (SPR) analog cell layout, in accordance with some embodiments.

FIG. 17 illustrates an example super power rail (SPR) analog cell layout, in accordance with some embodiments. In FIG. 17, the present disclosure introduces an approach to enhance thermal management. This can be achieved by thickening the bottom metal layer 0 (BM0) 1702 effectively, thereby expanding the pathways for a heat sink. In addition to thickening BM0 in the vertical direction, it's worth noting that BM0 can be configured with different widths in the Y-axis, as demonstrated by 1702 and 1704 in FIG. 17. Each of these configurations extends horizontally across the entire OD. It's important to emphasize that the representation in FIG. 17 is primarily for illustrative and comparative purposes, showcasing various width configurations of BM0 to illustrate the design possibilities.

The layout incorporates the use of feed-through vias (FTV) to connect to the thickened BM0 1704, facilitating an efficient heat dissipation mechanism within the integrated circuit. This design incorporates guidelines for arranging guard rings (GR) in an array, ensuring their proper placement to expand the path of the heat sink. The layout of FIG. 16 is aimed at enhancing thermal management within the circuit, optimizing heat dissipation, and maintaining efficient operation.

Figure 18:
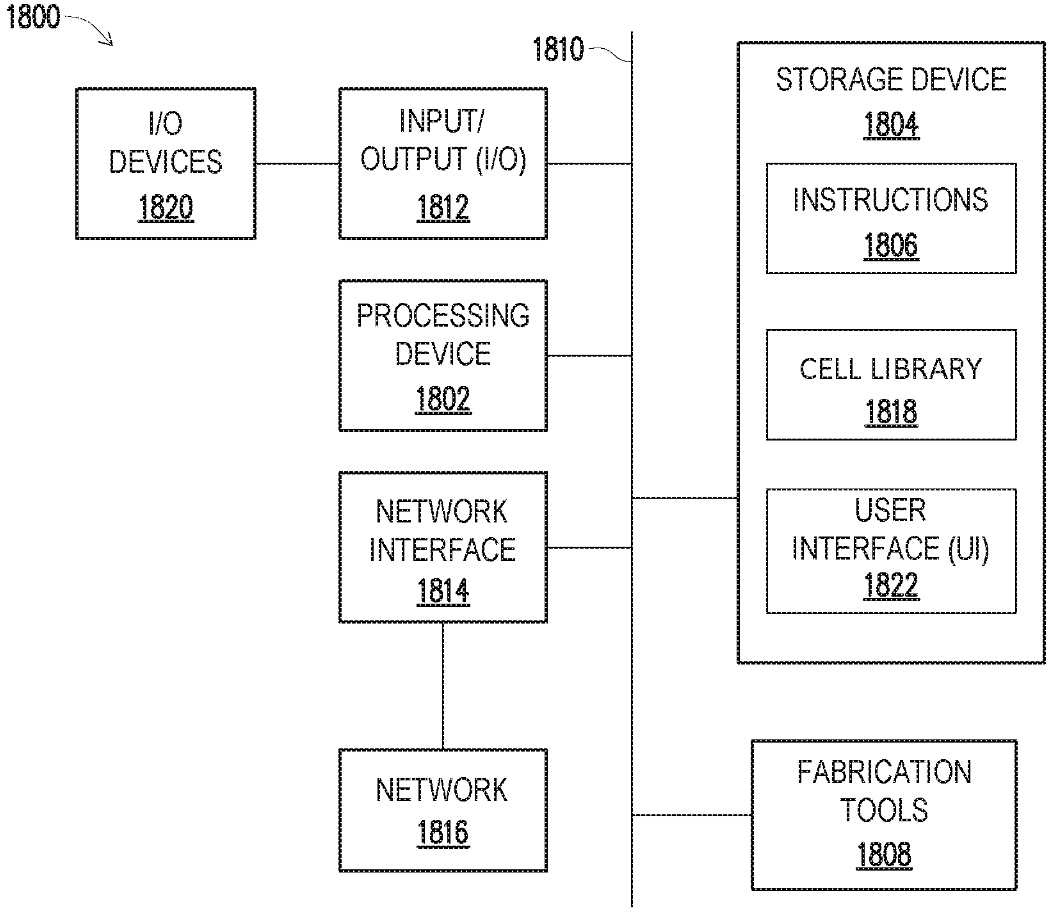
FIG. 18 illustrates an example system that is suitable for designing an integrated circuit, in accordance with some embodiments.

FIG. 18 illustrates an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house.

In some embodiments, the system 1800 includes an automated place and route (APR) system. In some embodiments, the system 1800 includes a processing device 1802 and a non-transitory, computer-readable storage medium 1804 ("storage device"). The processing device 1802 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1804 may be encoded with or store, for example, computer program code (e.g., a set of executable instructions 1806). Execution of the executable instructions 1806 by the processing device 1802 represents (at least in part) an ECAD tool that implements a portion or all of, the methods described herein to produce the designs for the structures and the ICs disclosed herein. Further, the fabrication tools 1808 may be included for layout and physical implementation of the ICs. In one or more embodiments, the storage device 1804 is a non-transitory electronic, magnetic, optical, electromagnetic, infrared, and/or a semiconductor system (or apparatus or device). For example, the storage device 1804 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, the storage device 1804 includes a compact disk-read only memory (CD-ROM), a compact disk-read/write (CD-R/W), and/or a digital video disc (DVD).

The processing device 1802 is operably connected to the storage device 1804 via a bus 1810. The processing device 1802 is also operably connected to an input/output (I/O) interface 1812 and a network interface 1814 by the bus 1810. The network interface 1814 is operably connected to a network 1816 so that the processing device 1802 and the storage device 1804 are capable of connecting to external elements via the network 1816. In one or more embodiments, the network 1816 is illustrative of any type of wired and/or wireless network, such as an intranet and/or a distributed computing network (e.g., the Internet).

The network interface 1814 allows the system 1800 to communicate with other computing or electronic devices (not shown) via the network 1816. The network interface 1814 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 1816.

The processing device 1802 is configured to execute the executable instructions 1806 encoded in the storage device 1804 to cause the system 1800 to be usable for performing some or all of the processes and/or methods described herein. For example, an electronic design application (e.g., in an ECAD system or as a standalone application) can be configured to perform the methods and techniques shown in FIGS. 1-17. Given the complexity of integrated circuits, and since integrated circuits include thousands, millions, or billions of components, the human mind is unable to perform the methods and techniques depicted in FIGS. 1-17. Unlike the human mind, an electronic design application is able to perform the operations associated with FIGS. 1-17.

In one or more embodiments, the storage device 1804 stores the executable instructions 1806 configured to cause the system 1800 to be usable for performing some or all of the processes and/or methods. In one or more embodiments, the storage device 1804 also stores information that facilitates execution of a portion of or all of the processes and/or methods. In one or more embodiments, the storage device 1804 stores a cell library 1818 that includes (at least in part) standard and/or previously designed cells.

The I/O interface 1812 is operably connected to I/O devices 1820. In one or more embodiments, the I/O devices 1820 include one or more of an image capture device, a microphone, a scanner, a keyboard, a keypad, a mouse, a trackpad, a touchscreen, and/or cursor direction keys for communicating information and commands to the processing device 1802. The I/O devices 1820 may also include one or more displays, one or more speakers, a printer, headphones, a haptic or tactile feedback device, and the like.

The system 1800 is configured to receive information through the I/O interface 1812. The information received through the I/O interface 1812 includes one or more of instructions, data, design rules, cell libraries, and/or other parameters for processing by the processing device 1802. The information is transferred to the processing device 1802 via the bus 1810. The system 1800 is configured to receive information related to a user interface (UI) through the I/O interface 1812. The information is stored in the storage device 1804 as a UI 1822 or for presentation in the UI 1822.

In some embodiments, a portion or all of the processes and/or methods is implemented as a standalone software application (e.g., an EDA) for execution by a processing device (e.g., processing device 1802). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1800. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1804). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1800 may include the fabrication tools 1808 for implementing the processes and/or methods stored in the storage device 1804. For instance, a synthesis may be performed on a design in which the behavior and/or functions desired from the design are transformed to a functionally equivalent logic gate-level circuit description by matching the design to cells selected from the cell library 1818. The synthesis results in a functionally equivalent logic gate-level circuit description, such as a gate-level netlist. Based on the gate-level netlist, a photolithographic mask may be generated that is used to fabricate the analog integrated circuit by the fabrication tools 1808.

Figure 19:
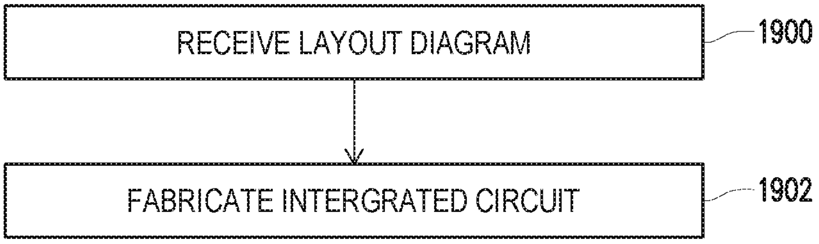
FIG. 19 illustrates a block diagram of a block diagram of an example integrated circuit manufacturing system and manufacturing flow, in accordance with some embodiments.

FIG. 19 depicts a flowchart of an example method of fabricating an analog integrated circuit. Initially, as shown in block 1900, a layout diagram of an analog integrated circuit is received. In some embodiments, the layout diagram is generating using one or more operations shown in FIGS. 1-17. For example, the layout diagram can be the final layout diagram produced at block 250 in FIG. 2. Based on the received layout diagram, the analog integrated circuit is fabricated at block 1902.

Figure 20:
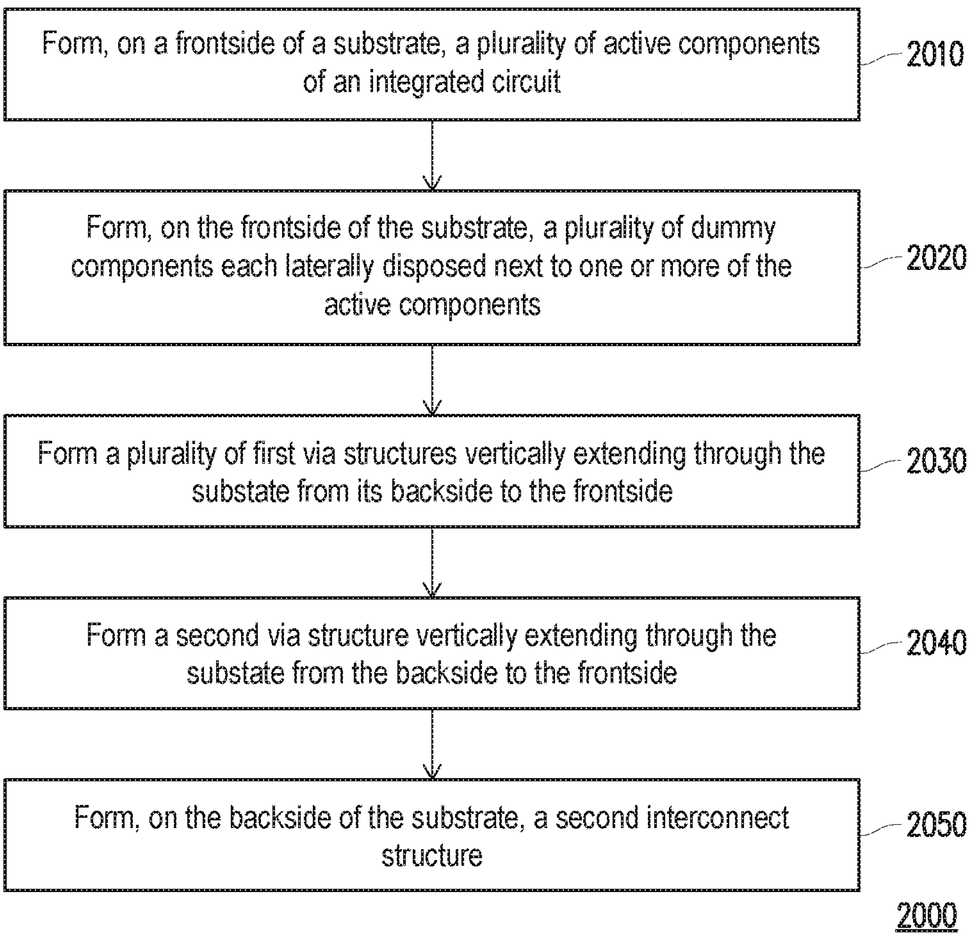
FIG. 20 illustrates an example flow chart of a method for fabricating an integrated circuit, in accordance with some embodiments.

FIG. 20 illustrates an example flow chart of a method 2000 for fabricating an integrated circuit, in accordance with some embodiments. It is understood that FIG. 20 has been simplified for a better understanding of the concepts of the present disclosure. Accordingly, it should be noted that additional processes may be provided before, during, and after the method of FIG. 1, and that some other processes may only be briefly described herein.

Referring now to FIG. 20, operation 2010 can forming a plurality of active components of an integrated circuit on a frontside of a substrate. The substrate may have a frontside and a backside opposite to each other. The substrate may be a semiconductor substrate, such as a bulk semiconductor, a semiconductor-on-insulator (SOI) substrate, or the like, which may be doped (e.g., with a p-type or an n-type dopant) or undoped.

Next, the method 2000 proceeds to operation 2020 of forming a plurality of dummy components each laterally disposed next to one or more of the active components on the frontside of the substrate. The plurality of dummy components are disposed next to the one or more of the active components along a first lateral direction or a second lateral direction. The plurality of dummy components form a part of a guard ring for the plurality of active components.

Next, the method 2000 proceeds to operation 2030 of forming a plurality of first via structures vertically extending through the substate from its backside to the frontside. Each of the first via structures is laterally disposed within a corresponding one of the active or dummy components. The plurality of first via structures are arranged with respect to one another along a tilted direction between the first and second lateral directions. Some of the plurality of first via structures are aligned with one another along the second lateral direction.

Next, the method 2000 proceeds to operation 2040 of forming a second via structure vertically extending through the substate from the backside to the frontside. The second via structure laterally extends within a corresponding one of the dummy components, laterally extends along an edge between one of the active components and one of the dummy components, or laterally extends along an edge between adjacent ones of the active components. In some embodiments, the second via structure, along the first lateral direction, extends along an edge between the first and second cells. In some embodiments, the second via structure, along the first lateral direction, extends between the pair of second active regions of the second cell.

Next, the method 2000 proceeds to operation 2050 of forming a second interconnect structure on the backside of the substrate. The second interconnect structure, coupled to the active components through at least one of the first via structures or the second via structure, is configured to carry a supply voltage for the integrated circuit.

As used herein, the terms “about” and “approximately” generally indicates the value of a given quantity that can vary based on a particular technology node associated with the subject semiconductor device. Based on the particular technology node, the term “about” can indicate a value of a given quantity that varies within, for example, 10-30% of the value (e.g., +10%, +20%, or +30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating integrated circuits, comprising:
- forming, on a frontside of a substrate, a plurality of active components of an integrated circuit;
- forming, on the frontside of the substrate, a plurality of dummy components each laterally disposed next to one or more of the active components;
- forming a plurality of first via structures vertically extending through the substrate from its backside to the frontside, wherein each of the first via structures is laterally disposed within a corresponding one of the active or dummy components;
- forming a second via structure vertically extending through the substrate from the backside to the frontside, wherein the second via structure laterally extends within a corresponding one of the dummy components, laterally extends along an edge between one of the active components and one of the dummy components, or laterally extends along an edge between adjacent ones of the active components; and
- forming, on the backside of the substrate, a second interconnect structure, wherein the second interconnect structure, coupled to the active components through at least one of the first via structures or the second via structure, is configured to carry a supply voltage for the integrated circuit.

2. The method of claim 1, further comprising:
- forming, over the active components and the dummy components, a plurality of first interconnect structures.

3. The method of claim 1, wherein the plurality of dummy components are disposed next to the one or more of the active components along a first lateral direction or a second lateral direction.

4. The method of claim 3, wherein the plurality of first via structures are arranged with respect to one another along a tilted direction between the first and second lateral directions.

5. The method of claim 3, wherein some of the plurality of first via structures are aligned with one another along the second lateral direction.

6. The method of claim 3, wherein the plurality of dummy components form a part of a guard ring for the plurality of active components.

7. The method of claim 1, wherein each of the plurality of active components corresponds to a respective one of a plurality of cells that are abutted to one another.

8. The method of claim 7, wherein the plurality of cells further include:
- a first one of the plurality of cells corresponding to the plurality of active components; and
- a second one of the plurality of cells that is disposed immediately next to the first cell along a first lateral direction or a second lateral direction.

9. The method of claim 8, wherein the first cell includes a pair of first active regions extending along the first lateral direction, and the second cell includes a pair of second active regions extending along the first lateral direction.

10. The method of claim 9, wherein each of the first via structures, along the second lateral direction, extends from a first edge to a second edge of a corresponding one of the first active regions and the second active regions.

11. The method of claim 10, wherein the second via structure, along the first lateral direction, extends along an edge between the first and second cells.

12. The method of claim 10, wherein the second via structure, along the first lateral direction, extends between the pair of second active regions of the second cell.

13. An integrated circuit, comprising:
- a plurality of active components operatively coupled to one another to form an integrated circuit, wherein the plurality of active components are arranged over a frontside of a substrate;
- a plurality of dummy components each laterally disposed next to one or more of the active components, wherein the plurality of dummy components are formed over the frontside of the substrate;
- an interconnect structure disposed on a backside of the substrate opposite to the frontside of the substrate and carries carrying a supply voltage;
- a plurality of first via structures each vertically extending through the substrate and laterally disposed within a corresponding one of the active or dummy components; and
- a second via structure vertically extending through the substrate, and laterally extending within a corresponding one of the dummy components, laterally extending along an edge between one of the active components and one of the dummy components, or laterally extending along an edge between adjacent ones of the active components.

14. The integrated circuit of claim 13, wherein the plurality of dummy components are disposed next to the one or more of the active components along a first lateral direction or a second lateral direction.

15. The integrated circuit of claim 14, wherein the plurality of first via structures are arranged with respect to one another along a tilted direction between the first and second lateral directions.

16. The integrated circuit of claim 14, wherein some of the plurality of first via structures are aligned with one another along the second lateral direction.

17. The integrated circuit of claim 14, wherein the plurality of dummy components form a part of a guard ring for the plurality of active components.

18. An integrated circuit, comprising:
- a plurality of active components operatively coupled to one another to form an integrated circuit, wherein the plurality of active components are arranged over a frontside of a substrate, a plurality of dummy components each laterally disposed next to one or more of the active components;

an interconnect structure disposed on a backside of the substrate opposite to the frontside of the substrate and carrying a supply voltage;

a plurality of first via structures each vertically extending through the substrate and laterally disposed within a corresponding one of the active or dummy components; and a second via structure vertically extending through the substrate, and laterally extending within a corresponding one of the dummy components, laterally extending along an edge between one of the active components and one of the dummy components, or laterally extending along an edge between adjacent ones of the active components.

19. The integrated circuit of claim 18, wherein the plurality of dummy components are formed over the frontside of the substrate.

20. The integrated circuit of claim 19, wherein the plurality of dummy components are disposed next to the one or more of the active components along a first lateral direction or a second lateral direction.

* * * * *